United States Patent
Gopalraja et al.

(10) Patent No.: US 6,485,618 B2
(45) Date of Patent: *Nov. 26, 2002

(54) INTEGRATED COPPER FILL PROCESS

(75) Inventors: Praburam Gopalraja, Sunnyvale, CA (US); Jianming Fu, San Jose, CA (US); Fusen Chen, Saratoga, CA (US); Girish Dixit, San Jose, CA (US); Zheng Xu, Foster City, CA (US); Sankaram Athreya, Sunnyvale, CA (US); Wei D. Wang, Santa Clara, CA (US); Ashok K. Sinha, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/917,985

(22) Filed: Jul. 30, 2001

(65) Prior Publication Data

US 2001/0050226 A1 Dec. 13, 2001

Related U.S. Application Data

(60) Division of application No. 09/518,180, filed on Mar. 2, 2000, now Pat. No. 6,277,249, which is a continuation-in-part of application No. 09/490,026, filed on Jan. 21, 2000, now Pat. No. 6,251,242.

(51) Int. Cl.$^7$ .................. C23C 14/34; C23C 16/06; H01L 21/203; C25D 5/02

(52) U.S. Cl. ................ 204/192.17; 204/192.15; 204/192.32; 204/192.35; 204/192.12; 438/675; 438/678; 438/687; 205/205; 205/215; 427/588

(58) Field of Search .......... 204/192.17, 192.12–192.15, 204/192.32–192.35; 438/678–687; 205/205–215; 427/588

(56) References Cited

U.S. PATENT DOCUMENTS

| | | | |
|---|---|---|---|
| 5,178,739 A | 1/1993 | Barnes et al. | 204/192.12 |
| 5,482,611 A | 1/1996 | Helmer et al. | 204/298.17 |
| 5,512,150 A | 4/1996 | Bourez et al. | 2204/192.2 |
| 5,589,041 A | 12/1996 | Lantsman | 204/192.33 |
| 5,685,959 A | 11/1997 | Bourez et al. | 204/192.2 |
| 5,865,961 A | 2/1999 | Yokoyama et al. | 204/192.12 |
| 5,897,752 A | 4/1999 | Hong et al. | 204/192.12 |
| 5,933,753 A | 8/1999 | Simon et al. | 438/629 |
| 5,985,762 A | 11/1999 | Geffken et al. | 438/687 |
| 6,080,284 A | 6/2000 | Miyaura | 204/192.12 |
| 6,274,008 B1 * | 8/2001 | Gopalraja et al. | 204/192.17 |
| 6,287,977 B1 * | 9/2001 | Hashim et al. | 438/722 |

FOREIGN PATENT DOCUMENTS

WO  WO 00/48226  8/2000

OTHER PUBLICATIONS

Kitamoto et al., "Compact sputtering apparatus for depositing Co–Cr alloy thin films in magnetic disk," Proceedings: The Fourth International Symposium on Sputtering & Plasma Processes, Kanazawa, Japan, Jun. 4–6, 1997, pp. 519–522.

(List continued on next page.)

Primary Examiner—Mark F. Huff
Assistant Examiner—Deborah Chacko-Davis
(74) Attorney, Agent, or Firm—Charles S. Guenzer

(57) ABSTRACT

A target and magnetron for a plasma sputter reactor. The target has an annular vault facing the wafer to be sputter coated. Various types of magnetic means positioned around the vault create a magnetic field supporting a plasma extending over a large volume of the vault. An integrated copper via filling process includes a first step of highly ionized sputter deposition of copper, a second step of more neutral, lower-energy sputter deposition of copper to complete the seed layer, and electroplating copper into the hole to complete the metallization.

26 Claims, 11 Drawing Sheets

OTHER PUBLICATIONS

Yamazato et al., "Preparation of TIN thin films by facing targets magnetron sputtering," *Proceedings: The Fourth International Symposium on Sputtering & Plasma Processes*, Kanazawa, Japan Jun. 4–6, 1997 pp. 635–638.

Musil et al., "Unbalanced magnetrons and new sputtering systems with enhanced plasma ionization," *Journal of Vaccum Science and Technology A*, vol. 9, No. 3, May/Jun. 1991, pp. 1171–1177.

Matsuoka et al., "Dense plasma production and film deposition by new high–rate sputtering using an electric mirror," *Journal of Vacuum Science and Technology A*, vol. 7, No. 4, Jul./Aug. 1989, pp. 2652–2657.

Ivanov et al., "Electron energy distribution function in dc magnetron sputtering discharge," *Vacuum*, vol. 43, No. 8, 1992, pp. 837–842.

* cited by examiner

INTEGRATED COPPER FILL PROCESS

RELATED APPLICATIONS

This application is division of Ser. No. 09/518,180, filed Mar. 2, 2000, now issued as U.S. Pat. No. 6,277,249, which is a continuation in part of Ser. No. 09/490,026, filed Jan. 21, 2000, now issued as U.S. Pat. No. 6,251,242.

BACKGROUND OF THE INVENTION

1. Field of the Invention

The invention relates generally to plasma sputtering. In particular, the invention relates to an integrated via filling process using sputtering.

2. Background Art

A semiconductor integrated circuit contains many layers of different materials usually classified according to whether the layer is a semiconductor, a dielectric (electrical insulator), or metal. However, some materials such as for creating diffusion barrier, for example, of TiN, are not so easily classified. The two principal current means of depositing metals and barrier materials are sputtering, also referred to as physical vapor deposition (PVD), and chemical vapor deposition (CVD). Of the two, sputtering has the inherent advantages of low cost source material and high deposition rates. However, sputtering has an inherent disadvantage when a material needs to filled into a deep narrow hole, that is, one having a high aspect ratio, or coated onto the sides of the hole, which is often required for barrier materials. Aspect ratios of 3:1 present challenges, 5:1 becomes difficult, 8:1 is becoming a requirement, and 10:1 and greater are expected in the future. Sputtering itself is fundamentally a nearly isotropic process producing ballistic sputter particles which do not easily reach the bottom of deep narrow holes. On the other hand, CVD tends to be a conformal process equally effective at the bottom of holes and on exposed top planar surfaces.

Up until the recent past, aluminum has been the metal of choice for the metallization used in horizontal interconnects. Vias extending between two levels of copper can also be formed of copper. Contacts to the underlying silicon present a larger problem, but may still be accomplished with copper. Copper interconnects are used to reduce signal delay in advanced ULSI circuits. Due to continued downward scaling of the critical dimensions of microcircuits, critical electrical parameters of integrated circuits, such as contact and via resistances, have become increasingly more difficult to achieve, In addition, due to the smaller dimensions, the aspect ratios of inter-metal features such as contacts and vias are also increasing. An advantage of copper is that it may be quickly and inexpensively deposited by electrochemical processes, such as electroplating. However, sputtering or possibly CVD of thin copper layers onto the walls of via holes is still considered necessary to act as an electrode for electroplating and as a seed layer for the electroplated copper. The discussion of copper processes will be delayed until later.

The conventional sputter reactor has a planar target in parallel opposition to the wafer being sputter deposited. A negative DC voltage is applied to the target sufficient to ionize the argon working gas into a plasma. The positive argon ions are attracted to the negatively charged target with sufficient energy to sputter atoms of the target material. Some of the sputtered atoms strike the wafer and form a sputter coating thereon. Most usually a magnetron is positioned in back of the target to create a magnetic field adjacent to the target. The magnetic field traps electrons, and, to maintain charge neutrality in the plasma, the ion density also increases. As a result, the plasma density and sputter rate are increased. The conventional magnetron generates a magnetic field principally lying parallel to the target.

Much effort has been expended to enable sputtering to effectively coat metals and barrier materials deep into narrow holes. High-density plasma (HDP) sputtering has been developed in which the argon working gas is excited into a high-density plasma, which is defined as a plasma having an ionization density of at least $10^{11}$ cm$^{-3}$ across the entire space the plasma fills except the plasma sheath. Typically, an HDP sputter reactor uses an RF power source connected to an inductive coil adjacent to the plasma region to generate the high-density plasma. The high argon ion density causes a significant fraction of sputtered atoms to be ionized. If the pedestal electrode supporting the wafer being sputter coated is negatively electrically biased, the ionized sputter particles are accelerated toward the wafer to form a directional beam that reaches deeply into narrow holes.

HDP sputter reactors, however, have disadvantages. They involve a relatively new technology and are relatively expensive. Furthermore, the quality of the sputtered films they produce is often not the best, typically having an undulatory surface. Also, high-energy ions, particularly the argon ions attracted as well to the wafer, tend to damage the material already deposited.

Another sputtering technology, referred to as self-ionized plasma (SIP) sputtering, has been developed to fill deep holes. See, for example, U.S. patent application Ser. No. 09/373,097 filed Aug. 12, 1999 by Fu and issued as U.S. Pat. No. 6,183,614 and U.S. patent application Ser. No. 09/414,614 filed Oct. 8, 1999 by Chiang et al. Both of these documents are incorporated by reference in their entireties. In its original implementations, SIP relies upon a somewhat standard capacitively coupled plasma sputter reactor having a planar target in parallel opposition to the wafer being sputter coated and a magnetron positioned in back of the target to increase the plasma density and hence the sputtering rate. The SIP technology, however, is characterized by a high target power density, a small magnetron, and a magnetron having an outer magnetic pole piece enclosing an inner magnetic pole piece with the outer pole piece having a significantly higher total magnetic flux than the inner pole piece. In some implementations, the target is separated from the wafer by a large distance to effect long-throw sputtering, which enhances collimated sputtering. The asymmetric magnetic pole pieces cause the magnetic field to have a significant vertical component extending far towards the wafer, thus enhancing and extending the high-density plasma volume and promoting transport of ionized sputter particles.

The SIP technology was originally developed for sustained self-sputtering (SSS) in which a sufficiently high number of sputter particles are ionized that they may be used to further sputter the target and no argon working gas is required. Of the metals commonly used in semiconductor fabrication, only copper has a sufficiently high self-sputtering yield to allow sustained self-sputtering.

The extremely low pressures and relatively high ionization fractions associated with SSS are advantageous for filling deep holes with copper. However, it was quickly realized that the SIP technology could be advantageously applied to the sputtering of aluminum and other metals and even to copper sputtering at moderate pressures. SIP sputtering produces high quality films exhibiting high hole filling factors regardless of the material being sputtered.

Nonetheless, SIP has some disadvantages. The small area of the magnetron requires circumferential scanning of the magnetron in a rotary motion at the back of the target. Even with rotary scanning, radial uniformity is difficult to achieve. Furthermore, very high target powers have been required in the previously known versions of SIP. High-capacity power supplies are expensive and necessitate complicated target cooling. Lastly, known versions of SIP tend to produce a relatively low ionization fraction of sputter particles, for example, 20%. The non-ionized fraction has a relatively isotropic distribution rather than forming a forward directed beam that occurs when ionized particles are accelerated toward a biased wafer. Also, the target diameter is typically only slightly greater than the wafer diameter. As a result, those holes being coated located at the edge of the target have radially outer sidewalls which see a larger fraction of the wafer and are more heavily coated than the radially inner sidewalls. Therefore, the sidewalls of the edge holes are asymmetrically coated.

Other sputter geometries have been developed which increase the ionization density. One example is a multi-pole hollow cathode target, several variants of which are disclosed by Barnes et al. in U.S. Pat. No. 5,178,739. Its target has a hollow cylindrical shape, usually closed with a circular back wall, and is electrically biased. Typically, a series of magnets, positioned on the sides of the cylindrical cathode of alternating magnetic polarization, create a magnetic field extending generally parallel to the cylindrical sidewall. Helmer et al. in U.S. Pat. No. 5,482,611 disclose a hollow cathode target in which an axially polarized tubular magnet surrounds the sides of the hollow cathode and extend in back of the cathode back wall to create a generally axial magnetic field but which forms a cusp at the cathode back wall Another approach uses a pair of facing targets facing the lateral sides of the plasma space above the wafer. Such systems are described, for example, by Kitamoto et al. in "Compact sputtering apparatus for depositing Co—Cr alloy thin films in magnetic disks," *Proceedings: The Fourth International Symposium on Sputtering & Plasma Processes*, Kanazawa, Japan, June 4–6, 1997, pp. 519–522, by Yamazato et al. in "Preparation of TiN thin films by facing targets magnetron sputtering, ibid., pp. 635–638, and by Musil et al. in "Unbalanced magnetrons and new sputtering systems with enhanced plasma ionization," *Journal of Vacuum Science and Technology A*, vol. 9, no. 3, May 1991, pp. 1171–1177. The facing pair geometry has the disadvantage that the magnets are stationary and create a horizontally extending field that is inherently non-uniform with respect to the wafer.

Musil et al., ibid., pp. 1174, 1175 describe a coil-driven magnetic mirror magnetron having a central post of one magnetic polarization and surrounding rim of another polarization. An annular vault-shaped target is placed between the post and rim. This structure has the disadvantage that the soft magnetic material forming the two poles, particularly the central spindle, are exposed to the plasma during sputtering and inevitably contaminate the sputtered layer. Furthermore, the coil drive provides a substantially cylindrical geometry, which may not be desired in some situations. Also, the disclosure illustrates a relatively shallow geometry for the target vault, which does not take advantage of some possible beneficial effects for a concavely shaped target.

It is thus desired to combine many of the good benefits of the different plasma sputter reactors described above while avoiding their separate disadvantages.

Returning now to copper processing and the structures that need to be formed for copper vias, it is well known to those in the art that, in a typical copper interconnect process flow, a thin barrier layer is first deposited onto the walls of the via hole to prevent copper from diffusing into the isolating dielectric layer separating the two copper levels and also to prevent intra/intermetal electrical shorts. A typical barrier for copper over silicon oxide consists of a combination of Ta/TaN, but other materials have been proposed, such as W/WN and Ti/TiN among others. hi a typical barrier deposition process, the barrier layer is deposited using PVD to form a continuous layer between the underlying and overlying copper layers including the contact area at the bottom of the via hole. Thin layers of these barrier materials have a small but finite transverse resistance. A structure resulting from this copper interconnect process flow produces a contact having a finite characteristic resistance (known in the art as a contact or via resistance) that depends on the geometry. Conventionally, the barrier layer at the bottom of the contact or via hole contributes about 30% of the total contact or via resistance.

As a result, there is a need in the art for a method and apparatus to form a contact between underlying and overlying copper layers having a low contact resistance but without unduly complicating the process.

A copper layer used to form an interconnect is conveniently deposited by electrochemical deposition, for example, electroplating. As is well known, an adhesion or seed layer of copper is usually required to nucleate an ensuing electrochemical deposition on the dielectric sidewalls as well as to provide a current path for the electroplating. In a typical deposition process, the copper seed layer is deposited using PVD methods, and the seed layer is typically deposited on top of the barrier layer. A typical barrier/seed layer deposition sequence also requires a pre-clean step to remove native oxide and other contaminants that reside on the underlying metal that has been previously exposed in etching the via hole. The pre-clean step, for example, a sputter etch clean step using an argon plasma, is typically performed in a process chamber that is separate from the PVD chamber used to deposit the barrier and seed layers. With shrinking dimension of the integrated circuits, the efficacy of the pre-clean step, as well as sidewall coverage of the seed layer within the contact/via feature becomes more problematical.

As a result, the art needs a method and apparatus that improves the pre-clean and deposition of the seed layer.

SUMMARY OF THE INVENTION

The invention includes a magnetron producing a large volume or thickness of a plasma, preferably a high-density plasma. The long travel path through the plasma volume allows a large fraction of the sputtered atoms to be ionized so that their energy and directionality can be controlled by substrate biasing.

The invention includes a two-step sputtering process, the first producing high-energy ionized copper sputter ions, the second producing a more neutral, lower-energy sputter flux. The two-step process can be combined with an integrated copper fill process in which the first step provides high sidewall coverage and may break through the bottom barrier layer and clean the copper. The second step completes the seed layer. Thereafter, copper is electrochemically deposited in the hole.

After forming a first level of metal on a wafer and pattern etching a single or dual damascene structure for a second level of metal on the wafer, the wafer is processed in a PVD cluster tool to deposit a barrier layer and a seed layer for the second metal level.

Instead of using a pre-clean step (for example, a sputter etch clean step), in accordance with the present invention, a simultaneous clean-deposition step (i.e., a self-cleaning deposition step) is carried out. The inventive self-cleaning deposition is carried out using a PVD deposition chamber that produces high-energy ionized material. In accordance with one aspect of one embodiment of the present invention, the high-energy ions physically remove material on flat areas of a wafer. In addition, the high-energy ions can dislodge material from a barrier layer disposed at the bottom of a contact/via feature. Further, in accordance with one embodiment of the present invention, wherein an initial thickness of the barrier layer is small, the high-energy ions can removed enough material from the barrier layer to provide direct contact between a seed layer and the underlying metal (for example, between a copper underlying layer and a copper seed layer). In addition to providing direct contact between the two copper layers, the inventive sputtering process also causes redeposition of copper over sidewalls of the contact/via to reinforce the thickness of the copper seed layer on the sidewall. This provides an improved path for current conduction, and advantageously improves the conformality of a layer subsequently deposited by electroplating.

DETAILED DESCRIPTION OF THE PREFERRED EMBODIMENTS

The invention may advantageously use a complexly shaped sputter target and a specially shaped magnetron which have the combined effect of impressing a magnetic field producing a thick region of relatively high plasma density. As a result, a large fraction of the atoms sputtered from the target can be ionized as they pass through the plasma region. Ionized sputtered particles can be advantageously controlled by substrate biasing to coat the walls of a deep, narrow hole.

Figure 1:
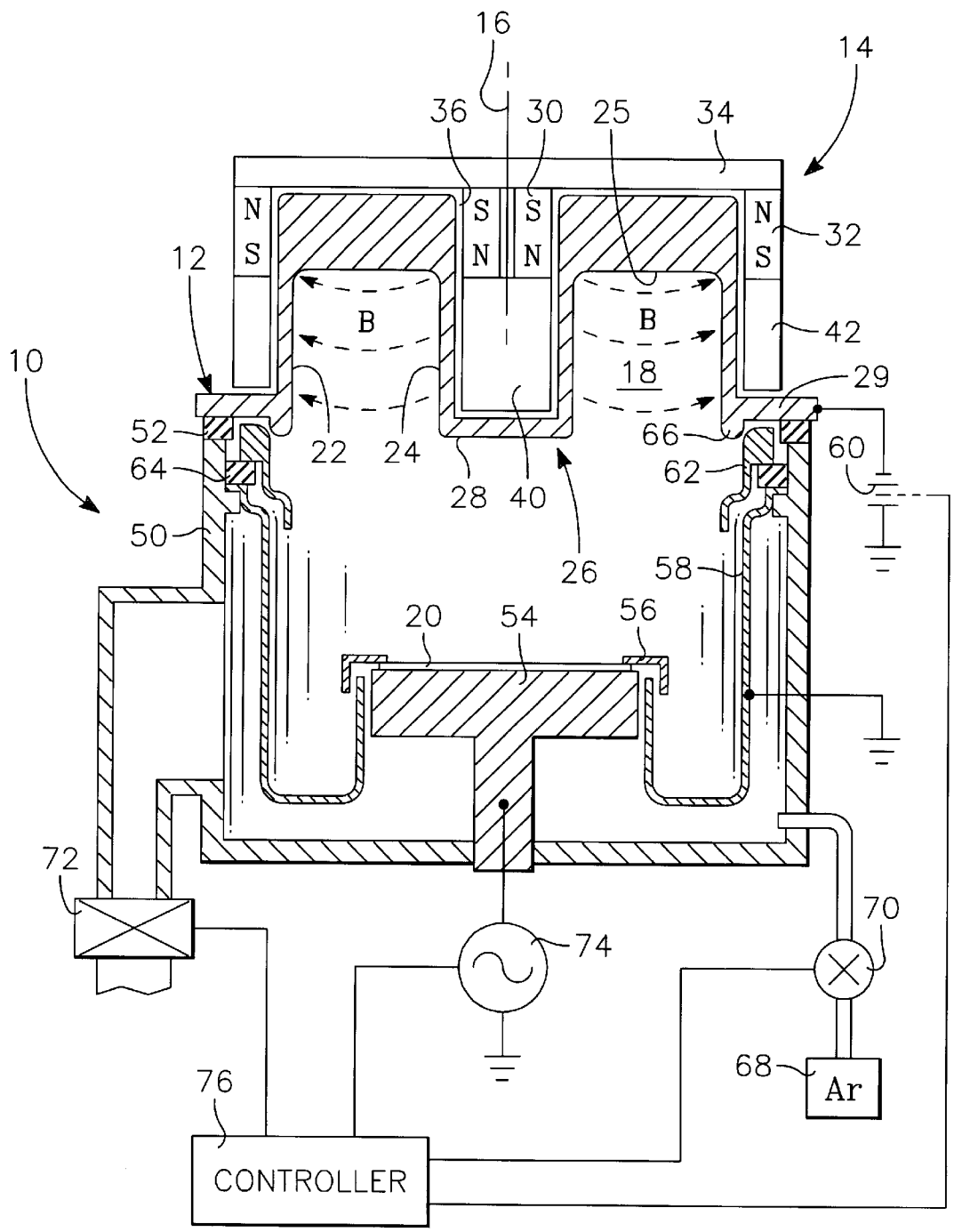
FIG. 1 is a schematic cross-sectional view of a first embodiment of a magnetron sputter reactor of the invention using a stationary, circularly symmetric magnetron.

A magnetron sputter reactor 10 of a first embodiment is illustrated in the schematic cross-sectional view of FIG. 1. It includes a specially shaped sputter target 12 and magnetron 14 symmetrically arranged about a central axis 16 in a reactor otherwise described for the most part by Chiang et al. in the above referenced patent. The target 12 or at least its interior surface is composed of the material to be sputter deposited. The invention is particularly useful for sputtering copper, but it may be applied to other sputtering materials as well. As is known, reactive sputtering of materials like TiN and TaN can be accomplished by using a Ti or Ta target and including gaseous nitrogen in the plasma. Other combinations of metal targets and reactive gases are possible. The target 12 includes an annularly shaped downwardly facing vault 18 facing a wafer 20 being sputter coated. The vault could alternatively be characterized as an inverted annular trough. The vault 18 has an aspect ratio of its depth to radial width of at least 1:2 and preferably at least 1:1. The vault 18 has an outer sidewall 22 outside of the periphery of the wafer 20, an inner sidewall 24 overlying the wafer 20, and a generally flat vault top wall or roof 25 (which closes the bottom of the downwardly facing vault 18). The target 12 includes a central portion forming a post 26 including the inner sidewall 24 and a generally planar face 28 in parallel opposition to the wafer 20. The target 12 also includes a flange 29 that is vacuum sealed to the chamber body of the sputter reactor 10.

The magnetron 14 illustrated in FIG. 1 includes one or more central magnets 30 having a first vertical magnetic polarization and one or more outer magnets 32 of a second vertical magnetic polarization opposite the first polarization and arranged in an annular pattern. In this embodiment the magnets 30, 32 are permanent magnets, that is, composed of strongly ferromagnetic material. The inner magnets 30 are disposed within a cylindrical central well 36 formed between the opposed portions of the inner target sidewall 24 while the outer magnets 32 are disposed generally radially outside of the outer target sidewall 22. A circular magnetic yoke 34 magnetically couples tops of the inner and outer magnets 30, 32. The yoke is composed of a magnetically soft material, for example, a paramagnetic material, such as SS410 stainless steel, that can be magnetized to thereby form a magnetic circuit for the magnetism produced by the permanent magnets 30, 32. Permanently magnetized yokes are possible but are difficult to obtain in a circular geometry.

A cylindrical inner pole piece 40 of a similarly magnetically soft material abuts the lower ends of the inner magnets 30 and extend deep within the target well 36 adjacent to the inner target sidewall 24. If the magnetron 14 is generally circularly symmetric, it is not necessary to rotate it for uniformity of sputter deposition. A tubular outer pole piece 42 of a magnetically soft material abuts the lower end of the outer magnets 32 and extends downwardly outside of the outer target sidewall 22. The magnetic pole pieces 40, 42 of FIG. 1 differ from the usual pole faces in that they and the magnets 30, 32 are configured and sized to emit a magnetic field B in the target vault 18 that is largely perpendicular to the magnetic field of the corresponding associated magnets 30, 32. In particular, the magnetic field B is generally perpendicular to the target vault sidewalls 22, 24.

This configuration has several advantages. First, the electrons trapped by the magnetic field B, although gyrating about the field lines, otherwise travel generally horizontally and radially with respect to the target central axis 16. The electrons strike the target sidewalls 22, 24 and are re-emitted at angles generally isotropic with respect to the magnetic field B. That is, electron loss is minimized, thus increasing the plasma density. Secondly, the depth of the magnetic field B is determined by the height of the target sidewalls 22, 24. This depth can be considerably greater than that of a high-density plasma region created by magnets in back of a planar target. As a result, sputtered atoms traverse a larger region of a high-density plasma and are accordingly more likely to become ionized. The support structure for the magnetron 14 and its parts is not illustrated but can be easily designed by the ordinary mechanic.

The remainder of the sputter reactor 10 is similar to that described by Chiang et al. in the above referenced patent application although a short-throw rather than a long-throw configuration may be used. The target 12 is vacuum sealed to a grounded vacuum chamber body 50 through a dielectric target isolator 52. The wafer 20 is clamped to a heater pedestal electrode 54 by, for example, a clamp ring 56 although electrostatic chucking is possible. An electrically grounded shield 58 acts as an anode with respect to the cathode target 12, which is negatively biased by a power supply 60. DC magnetron sputtering is conventional in commercial applications, but RF sputtering can enjoy the advantages of the target and magnetron of the invention and is especially advantageous for sputtering non-metallic targets. An electrically floating shield 62 is supported on the electrically grounded shield 58 or chamber 50 by a dielectric shield isolator 64. A cylindrical knob 66 extending downwardly from the outer target sidewall 22 and positioned inwardly of the uppermost part of the floating shield 62 protects the upper portion of the floating shield 62 and the target isolator 52 from being sputter deposited from the strong plasma disposed within the target vault 18. The gap between the upper portion of the floating shield 62 and the target knob 66 and flange 12 is small enough to act as a dark space preventing the plasma from propagating into the gap.

A working gas such as argon is supplied into the chamber from a gas source 68 through a mass flow controller 70. A vacuum pumping system 72 maintains the chamber at a reduced pressure, typically a base pressure in the neighborhood of $10^{-8}$ Torr. Although a floating pedestal electrode 54 can develop a desired negative self-bias, it is typical in SIP sputtering for an RF power supply 74 to RF bias the pedestal electrode 54 through an isolation capacitor, which results in a negative DC self-bias. A controller 76 regulates the power supplies 60, 74, mass flow controller 70, and vacuum system 72 according to a sputtering recipe prerecorded in it.

The target and magnetron structure has several advantages. As mentioned previously, secondary electrons are largely trapped within the vault 18 with little loss even upon collision with the target sidewalls 22, 24. Also, the plasma thickness is relatively large, determined by the sidewall heights, thereby increasing the ionization fraction of the sputtered target atoms. The separation of the inner and outer poles 40, 42 is relatively small, thereby increasing the magnetic field intensity within the vault 18. The target 12 is continuous across the pole pieces 40, 42, thus preventing the magnetic material of the poles from being sputtered and deposited on the semiconductor wafer 20.

Figure 2:
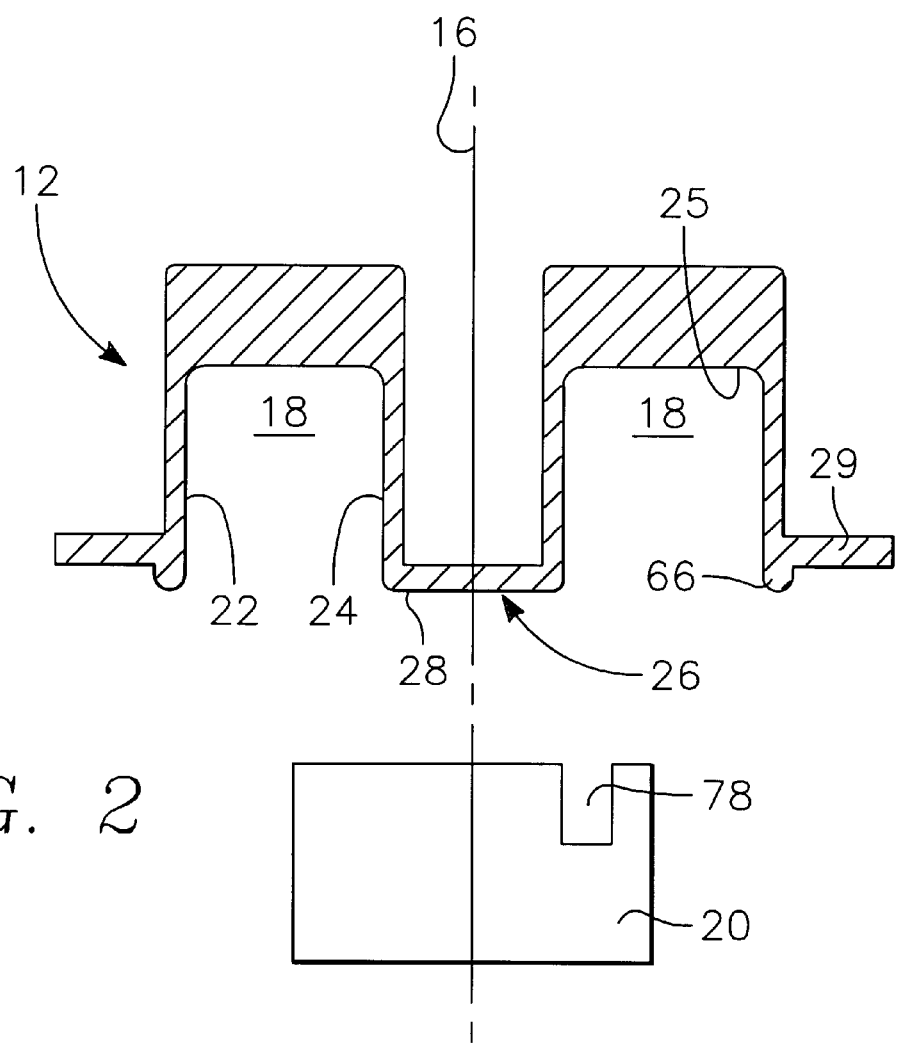
FIG. 2 is a schematic cross-sectional diagram illustrating the collimating function of the target of the invention.

The high aspect ratio of the vault 18 also improves the symmetric filling of holes located near the edge of the wafer, particularly in configurations having a shorter throw than that illustrated in FIG. 1. As schematically illustrated in FIG. 2, a hole 78 located at the right edge of the wafer 20 is to have a conformal layer sputter deposited on its sides. The size of the hole 78 and the thickness of the wafer 20 are greatly exaggerated, but the geometry remains approximately valid. If a planar target were being used, the right side of the wafer hole 78 would see a much larger fraction of the target than the left side and would thus be coated with a commensurately thicker layer. However, with the vault-shaped target 12, the hole 78 sees neither the inner sidewall 24 of the left side of the vault 18 nor the vault top wall 25. Even the upper portion of the outer sidewall 22 of the left side of the vault 18 is shielded from the wafer hole 78 by the inner sidewall 24 of the left side of the vault 18. As a result, the two sidewalls of the hole 78 to be coated see areas of the vault-shaped target that are much closer in size than for a planar target, and the sidewall coating symmetry is thereby greatly increased.

The target structure, as a result, produces a degree of collimation but without an apertured collimator which tends to become clogged with sputtered material. The effect is increased by a high aspect ratio for the vault, preferably at least 1:1.

Figure 3:
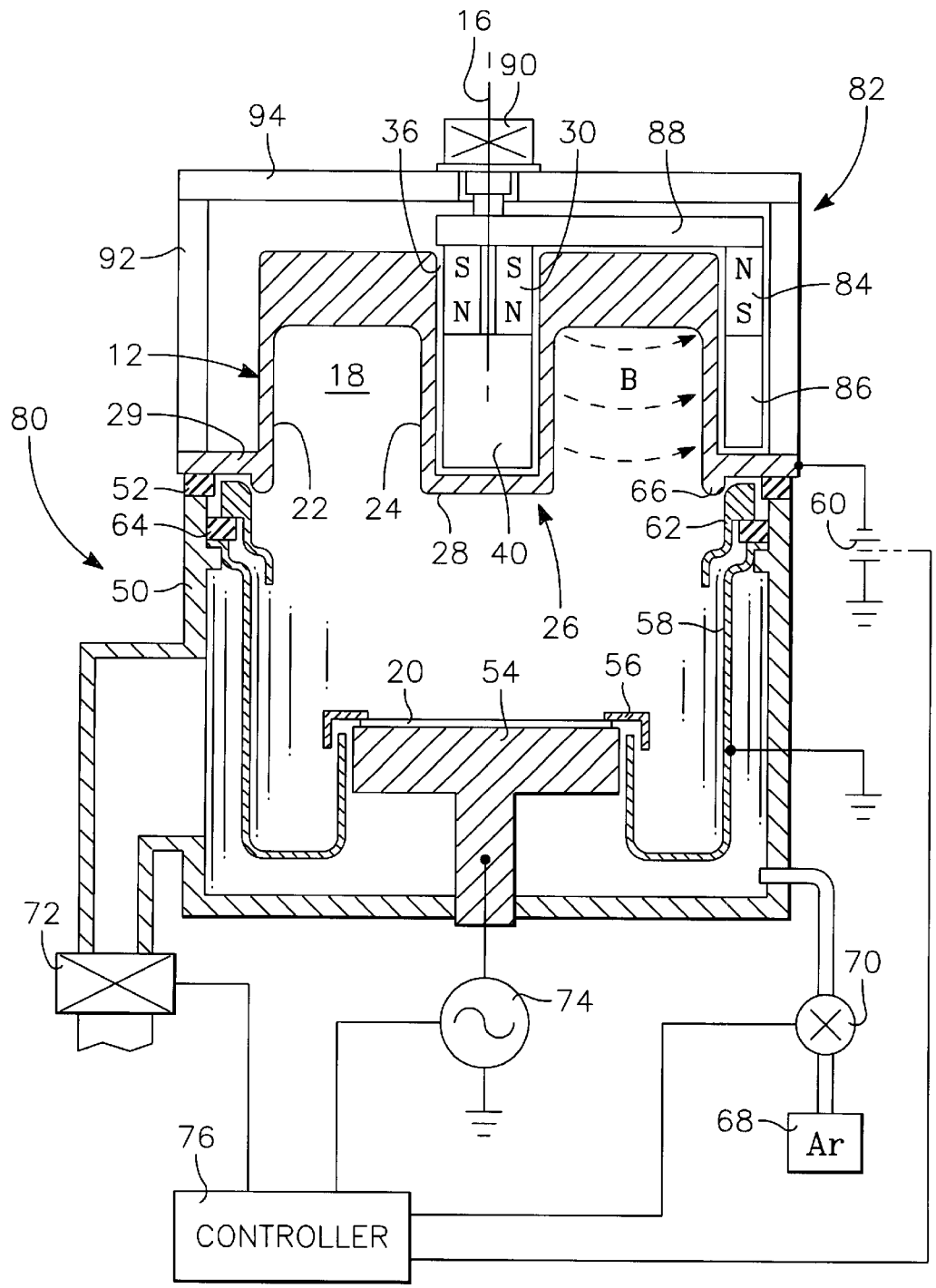
FIG. 3 is a schematic cross-sectional view of a second embodiment of a magnetron sputter reactor of the invention using a rotating, segmented magnetron with vertically magnetized magnets.

A sputter reactor 80 of second embodiment of the invention is illustrated in the schematic cross-sectional view of FIG. 3. A magnetron 82 includes the previously described inner magnets 30 and inner pole piece 40. However, one or more outer magnets 84 and an outer pole piece 86 extend around only a segment of the circumference of the target, for example between 15° and 90°. An asymmetric magnetic yoke 88 shaped as a sector magnetically couples the inner and outer magnets 30, 84 but only on the side of target well 36 toward the outer magnets 84. As a result, a high-density plasma is generated in only a small circumferential portion of the target vault 18. For self-ionized plating (SIP) and particularly sustained self-sputtering (SSS), a high plasma density is desired. In view of the limited capacity of realistic power supplies 60, the high plasma density can be achieved by reducing the area of the magnetron 82.

To achieve uniform sputtering, a motor 90 is supported on the chamber body 50 through a cylindrical sidewall 92 and roof 94 preferably electrically isolated from the biased target flange 29. The motor 90 has a motor shaft connected to the yoke 88 at the target axis 16 and rotates the magnetron 82 about that axis 16 at a few hundred rpm. Mechanical counterbalancing may be provided to reduce vibration in the rotation of the axially offset magnetron 82.

Figure 4:
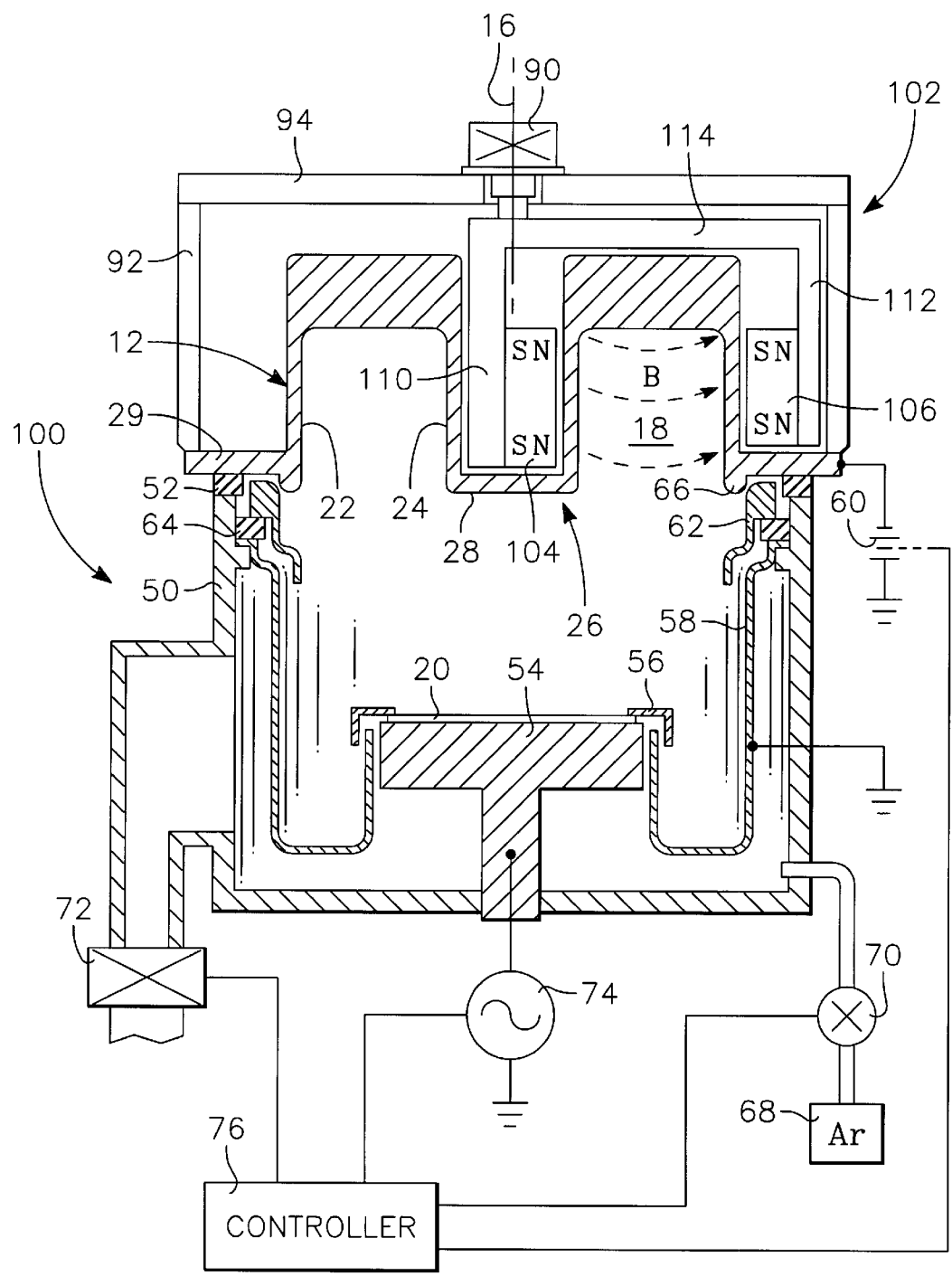
FIG. 4 is a schematic cross-sectional view of a third embodiment of a magnetron sputter reactor of the invention using a rotating, segmented magnetron with radially magnetized magnets.

Other magnet configurations are possible to produce similar magnetic field distributions. A sputter reactor 100 of a third embodiment of the invention is illustrated in the schematic cross-sectional view of FIG. 4. A magnetron 102 includes an inner magnet 104 having a magnetization direction generally aligned with a radius of the target 12 about the target axis 16. One or more outer magnets 106 is similarly radially magnetized but anti-parallel to the magnetization of the inner magnet 104. A C-shaped magnetic yoke has two arms 110, 112 in back of and supporting the respective magnets 104, 106 and a connector 114 supported on and rotated by the shaft of the motor 90.

The magnets 104 with respect to the center of the vault 18, 106 may be advantageously positioned only on reduced circumferential portions of the sidewalls 24, 22 of the target vault 18 so as to concentrate the magnetic field there. Furthermore, in this configuration extending along only a small segment of the target periphery, the magnets 104, 106 may be conveniently formed of plate magnets.

Figure 5:
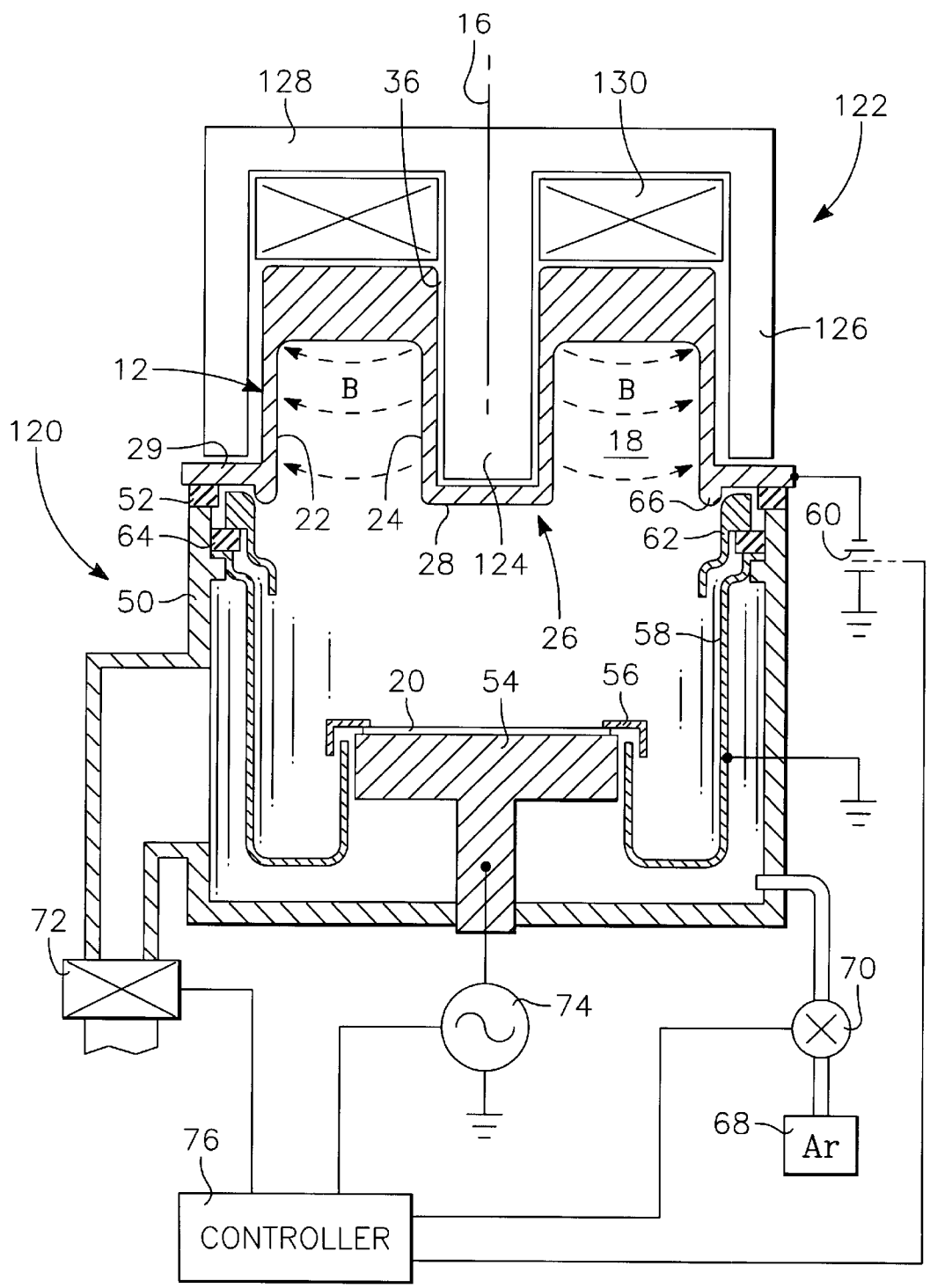
FIG. 5 is a schematic cross-sectional view of a fourth embodiment of a magnetron sputter reactor of the invention using an electromagnetic coil.

Electromagnetic coils may replace the permanent magnets of the previously described embodiments. A sputter reactor 120 of a fourth embodiment of the invention is illustrated in the schematic cross-sectional view of FIG. 5. A magnetron 122 includes a magnetic yoke including a central spindle 124 fit into the well 36 of the target 12 and a tubular rim 126 surrounding the outer sidewall 24 of the target vault 18. The magnetic yoke also includes a generally circular back piece 128 magnetically coupling the spindle 124 and the rim 126. An electromagnetic coil 130 is wound around the spindle 124 below the back piece 128 and inside of the rim 126. The coil 130 is preferably powered by a DC electrical source but a low-frequency AC source can be used. The coil 130 in conjunction with the magnetic yoke creates a generally radial magnetic field in the target vault 18.

The previously described embodiments have emphasized sputtering the vault sidewalls 22, 24 preferentially to sputtering the vault top wall or roof 25 (see FIG. 1) since relatively few of the magnetic field lines terminate on the vault roof 25. The metal ionization fraction can be increased if sputtering is increased in the vault roof 25 since the plasma thickness experienced by the average sputtered atom is increased. Also, the collimation produced by the vault 18 is increased.

Figure 6:
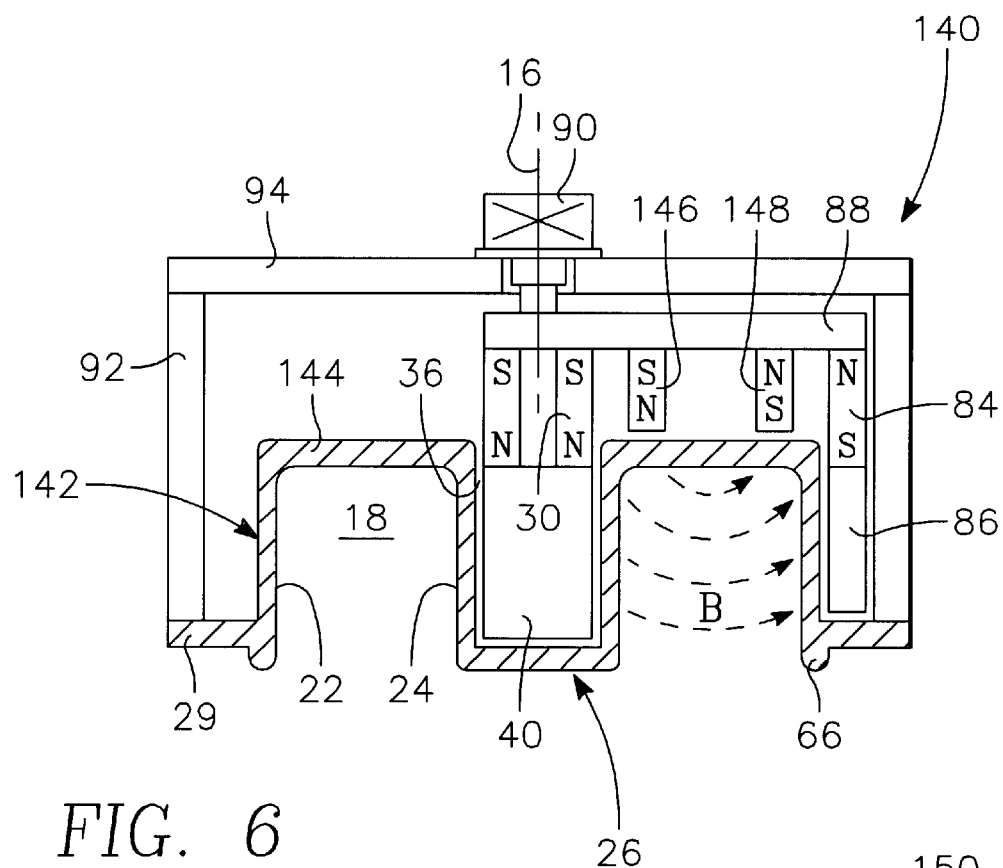
FIG. 6 is a cross-sectional view of a fifth embodiment of a magnetron of the invention using additional magnets at the roof of the vault to increase the roof sputtering.

The increased roof sputtering can be achieved in a number of ways. In a fifth embodiment of a magnetron 140 illustrated in cross-section in FIG. 6 with the remainder of the sputtering chamber being similar to the parts illustrated in FIG. 3. A target 142 is similar to the previously described target 12 except for a thinner roof portion 144. Similarly to the magnetron 82 of FIG. 3, it includes the rotatable yoke 88 supporting the inner magnets 30 of a first vertical polarity magnetically coupled to the inner pole piece 40 and the outer magnets 84 of a second vertical polarity magnetically coupled to the outer pole piece 86. These magnets 30, 84 and pole pieces 40, 86 produce a generally radial magnetic field B extending between the sidewalls 22, 24 of the vault 18. The magnetron 82 additionally supports on the magnetic yoke 88 an inner roof magnet 146 of the first vertical polarity aligned with the inner magnets 30 and an outer roof magnet 148 of the second vertical polarity aligned with the outer magnets 86. The opposed roof magnets 146, 148 magnetically coupled by the yoke 88 produce a semi-toroidal magnetic field B penetrating the vault roof 144 at two locations. Thereby, electrons are trapped along the semi-toroidal magnetic field and increase the plasma density near the vault roof 144, thereby increasing the sputtering of the vault roof 144.

In the illustrated embodiment, the outer magnets 84 and outer pole piece 86 occupy only a segment of the periphery of the target 142 but are rotated along that periphery by the motor 90. Similarly, inner and outer roof magnets 146, 148 extend only along a corresponding segment angle. However, a corresponding and probably preferred non-rotating magnetron can be created by making the roof magnets 146, 148, outer magnet 84, and outer pole piece 86 in annular shapes. The same circularly symmetric modification may be made to the embodiments described below.

Figure 7:
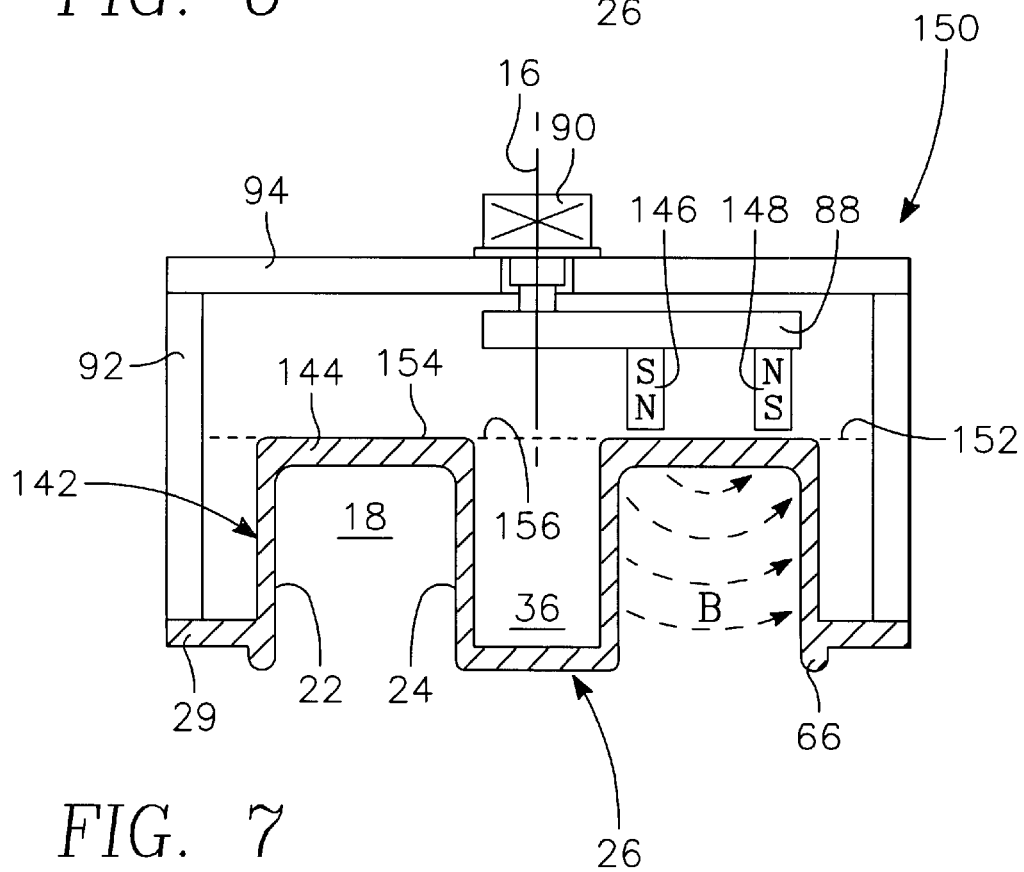
FIG. 7 is a cross-sectional view of a sixth embodiment of a magnetron of the invention using only the vault magnets.

The roof sputtering can be further emphasized by a sixth embodiment of a magnetron 150, illustrated in FIG. 7, which includes the inner and outer roof magnets 146, 148 but which in the illustrated embodiment includes neither the inner magnets within the well 36 nor the outer magnets outside of the outer sidewall 22. This configuration produces a relatively strong semi-toroidal magnetic field B adjacent to the vault roof 144 and a weaker magnetic field B in the body of the vault 18 adjacent to the sidewalls 22, 24. Therefore, there will be much more sputtering of the roof 144 than of the sidewalls 22, 24. Nonetheless, magnetic field lines in the vault body terminate at the sidewalls 22, 24, thereby decreasing electron loss out of the plasma. Hence, the magnetic field intensity may be low in the vault, but the plasma density is still kept relatively high there so that the target atoms sputtered from the roof 144 still traverse a thick plasma region and are accordingly efficiently ionized.

Since no magnets or pole pieces are placed in the target well 36 or outside of the outer target sidewall 22 and assuming the target material is non-magnetic, the inner and outer sidewalls 24, 22 may be increased in thickness even to the point that there is no well and no appreciable volume between the outer sidewall 22 and the chamber wall. That is, the back of the target 142 may have a substantially planar face 152, 154, 156. However, the inventive design of this embodiment still differs from a target having a circularly corrugated surface in that the spacing of the opposed roof magnets 146, 148 is at least half of the radial vault dimension and preferably closer to unity. This is in contrast to the embodiments of FIGS. 1, 3, and 4 in which the two sets of magnets are separated preferably by between about 100% and 150% of the vault width. Alternatively stated, the width of the vault 18 in the radial direction should be at least 2.5 cm, preferably at least 5 cm, and most preferably at least 10 cm. These dimensions, combined with the aspect ratio being at least 1:2 assures that the vault width is at least 10 times and preferably at least 25 times the plasma dark space, thus guaranteeing that the plasma conforms to the shape of the vault 18. These vault widths are easily accommodated in a sputter reactor sized for a 200 mm wafer. For larger wafers, more complex target shapes become even easier to implement.

Figure 8:
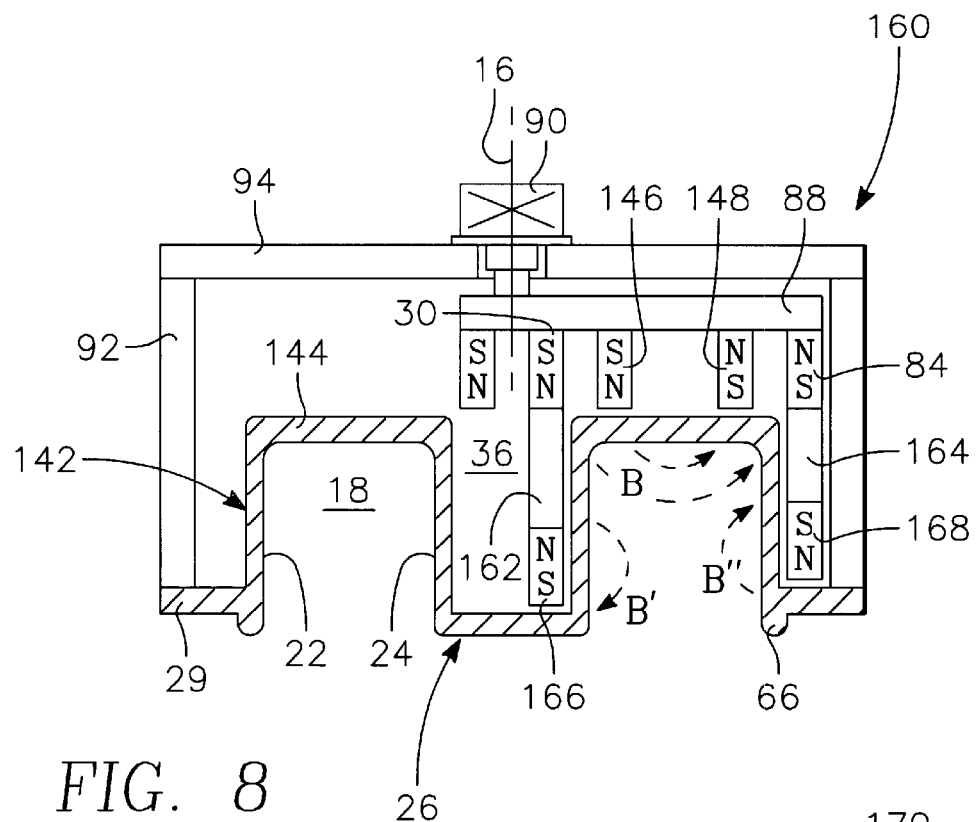
FIG. 8 is a cross-sectional view of a seventh embodiment of a magnetron of the invention using additional confinement magnets at the bottom sidewall of the vault.

A seventh embodiment of a magnetron 160 illustrated in the cross-sectional view of FIG. 8 includes the inner and outer main magnets 30, 84, although they are preferably somewhat shorter and do not extend below the vault roof 144. The magnetron also includes the inner and outer roof magnets 146, 148. However, neither the inner pole piece nor the outer pole piece needs to be used to couple the magnetic field from the main magnets 30, 84 into the vault 18. Instead, all these magnets produce a horizontally oriented semi-toroidal field B adjacent the vault roof 144. Some of these magnets may be eliminated as long as there are opposed magnets associated with the inner and outer target sidewalls 22, 24. Instead of ferromagnetic or paramagnetic pole pieces, non-magnetic or even diamagnetic spacers 162 are supported below the inner and outer main magnets 30, 84 respectively. The inner spacer 162 supports on its lower end an sidewall inner magnet 166 of the second magnetic polarity, that is, opposite that of its associated main inner magnet 30. Similarly, the outer spacer 164 supports on its lower end an sidewall outer magnet 168 of the first magnetic polarity, that is, opposite that of its associated main outer magnet 84. Both the sidewall magnets 166, 168 are located near the bottom of the respective vault sidewalls 24, 22. Because, they have polarities opposed to those of their associated main magnets 30, 84 they create two generally vertically extending semi-toroidal magnetic fields B' and B" near the bottom of the vault sidewalls 24, 22. Because of their opposed magnetic orientations, the sidewall magnets 166, 168 create two anti-parallel components of radial magnetic field across the vault 18. However, because of the relative spacings of the poles, the semi-toroidal magnetic fields B' and B" dominate.

In one sub-embodiment, the horizontally extending magnetic field B near the vault roof 144 is much stronger than the vertically extending magnetic fields B' and B" near the vault sidewalls 24, 22. As a result, sputtering of the roof 144 predominates. Alternatively, increased sidewall fields B' and B" can increase the amount of sidewall sputtering in a controlled way. In any case, the vertically extending sidewall fields B' and B" are sufficient to support a plasma throughout much of the body of the vault 18. Also, the sidewall fields B' and B" are oriented to repel electrons in the plasma flux from the roof 144, thereby decreasing the electron loss of that plasma.

Figure 9:
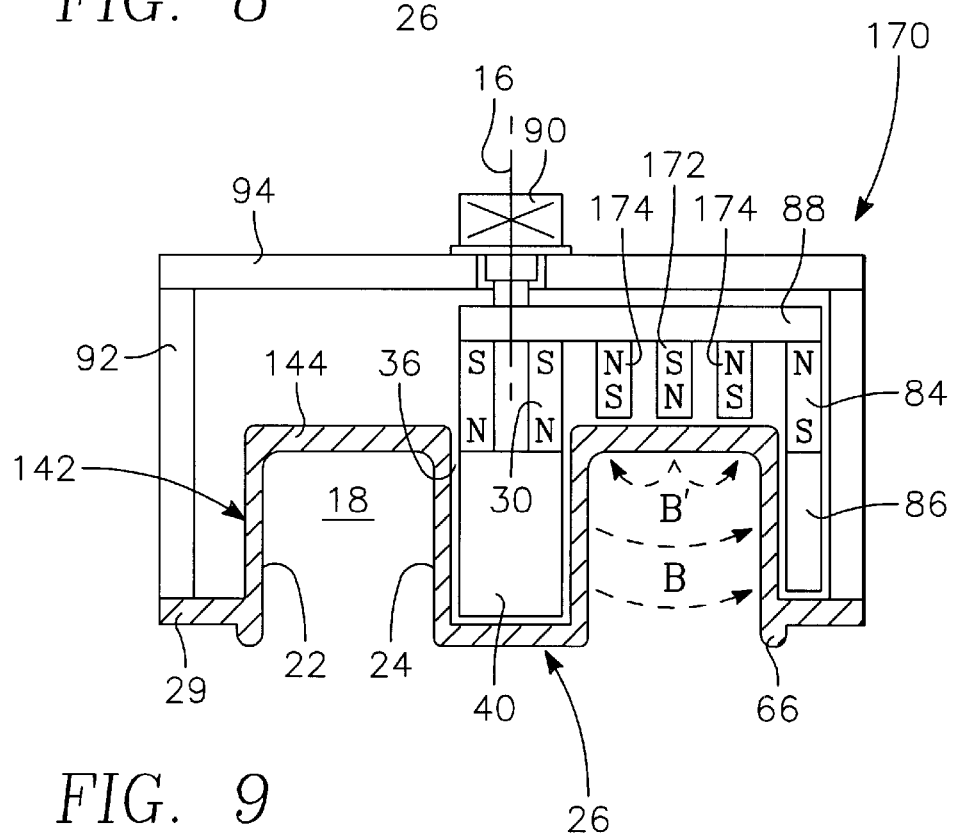
FIG. 9 is a cross-sectional view of an eighth embodiment of a magnetron of the invention using a closed magnetron over the vault roof and separate magnets for the vault sidewalls.

All of the previous embodiments have used magnets that extend generally along either the entire circumference or a segment of the circumference of various radii of the target. However, an eighth embodiment of a magnetron 170 illustrated in the cross-section view of FIG. 9 treats the planar vault roof 144 distinctly differently from the band-shaped vault sidewalls 22, 24. The sidewall magnetic assembly is similar to that of FIG. 6 and includes the rotatable yoke 88 supporting the inner magnets 30 of a first vertical polarization magnetically coupled to the inner pole piece 40 and the segmented outer magnets 84 of an opposed second vertical polarization magnetically coupled to the outer pole piece. These produce a generally radially directly magnetic field B across the vault 18. The rotating magnetic yoke 88 also supports a closed magnetron over the vault roof 144 including an inner magnet 172 of one vertical magnetic polarization and a surrounding outer magnet 174 of the other vertical magnetic polarization producing between them a cusp-shaped magnetic field B' adjacent the vault roof 144. In the simplest sub-embodiment, the inner magnet 172 is cylindrical, and the outer magnet 174 is annular or tubular producing a circularly symmetric cusp field B'. However, other shapes are possible, such as a radially or circumferentially aligned racetrack or a pair of nested segment-shaped magnets. The roof magnetron of FIG. 9 is the general type of magnetron described by Fu and by Chiang et al. in the previously referenced patent applications for SIP sputtering of a planar target, and those references provide guidance on the design of such a closed magnetron. Fu in the aforecited patent application describes a magnetron having asymmetric areas for the inner and outer poles, which in some designs result in asymmetric magnetic flux. In particular, the total magnetic flux ∫B·dS produced by the pole of the inner magnet 172 of FIG. 9 is much less than that produced by the surrounding pole of the outer magnet 174, for example, by at least a factor of 1.5 and preferably 2.

The figure does not adequately illustrate the magnetic yoke 88 which in the conceptually simplest implementation would magnetically isolate the roof magnets 172, 174 from the sidewall magnets 30, 84 while still magnetically coupling together the roof magnets 172, 174 and separately coupling together the sidewall magnets 30, 84. However, in view of the large number of magnets, a more complex magnetic circuit can be envisioned.

As has been shown in the cited patent applications, such a small closed roof magnetron will be very effective in highly ionized sputtering of the target roof 144. The sidewall magnets 30, 84 on the other hand will extend the plasma region down the height of the sidewalls 22, 24 as well as cause a degree of sidewall sputtering depending on the relative magnetic intensities.

The relative magnetic polarizations of roof magnets 172, 174 relative to those of the sidewall magnets 30, 84 may be varied. Also, the sidewall magnets 30, 84 and particularly the outer sidewall magnet 84 may be made fully annular so as to close on themselves so that optionally they do not need to be rotated and may be coupled by their own stationary yoke while the roof magnets 172, 174 do rotate about the circular planar area on the back of the vault roof 144 and are coupled by their rotating own yoke.

Other combinations of the closed roof magnetron and the sidewall magnets of other embodiments are possible.

Figure 10:
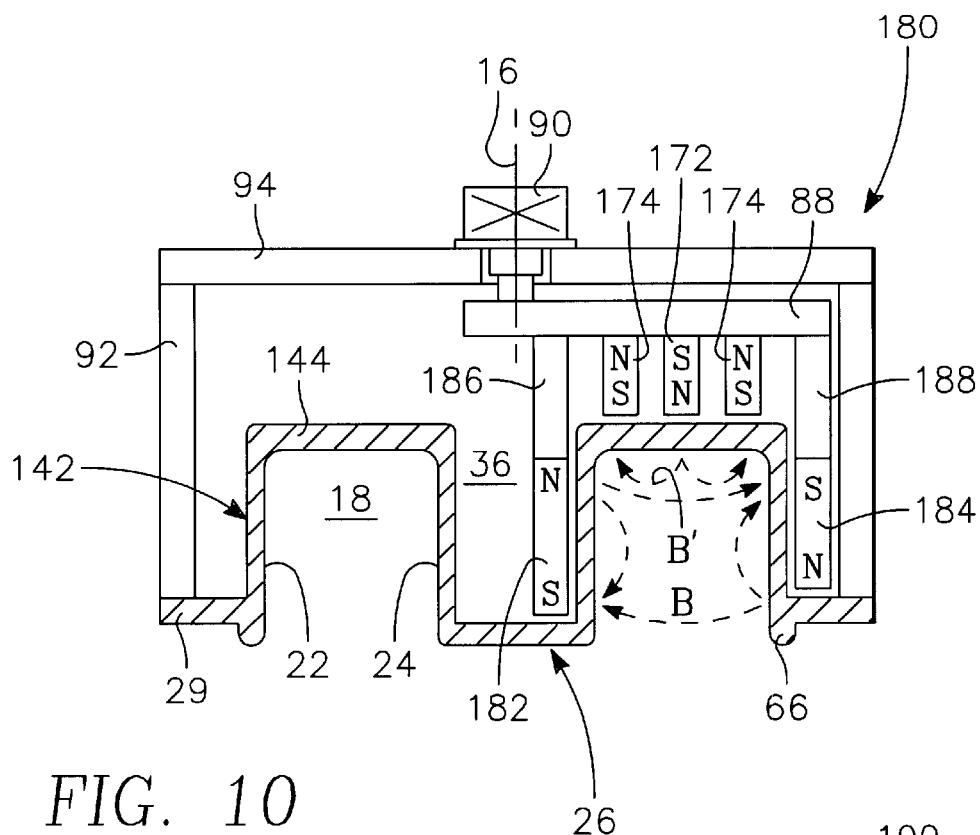
FIGS. 10–12 are cross-sectional view of ninth through eleventh embodiments of magnetrons of the invention.

A ninth embodiment of a magnetron 180 of the invention is illustrated in the cross-sectional view of FIG. 10 includes the inner and outer magnets 172, 174 overlying the roof of the vault 144. Side magnets 180, 182 disposed outside of the vault sidewalls have opposed vertical magnetic polarities but they are largely decoupled from the top magnets 172, 174 because they are supported on the magnetic yoke 88 by non-magnetic supports 184, 188. As a result, the side magnets 180, 182 create a magnetic field B in the vault that has two generally anti-parallel components extending radially across the vault as well as two components extending generally parallel to the vault sidewalls. Thus, the magnetic field B extends over a substantial depth and further repels electrons from the sidewalls 142. In the illustrated embodiment, all the side magnets 180, 182 are segmented and rotate with the top magnets 172, 174. However, a mechanically simpler design forms the side magnets 180, 182 in annular shapes and leaves them stationary.

Figure 11:
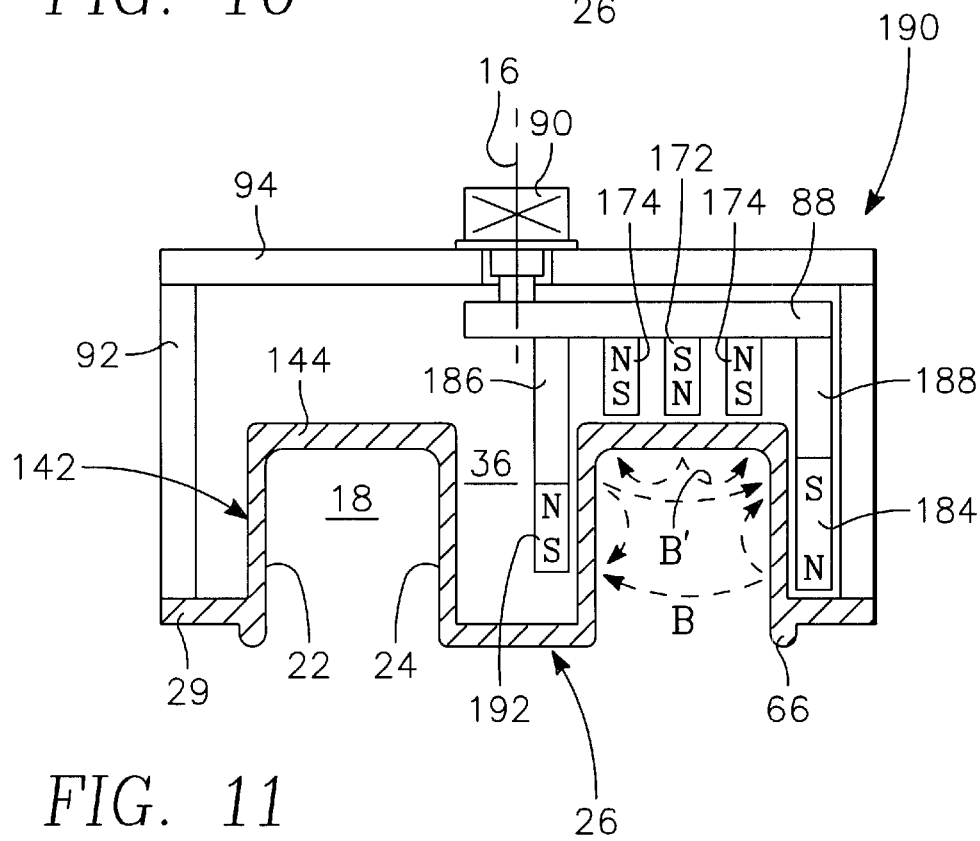

A tenth embodiment 190 illustrated in the cross-sectional view of FIG. 11 is similar to the magnetron 180 of FIG. 10 except that an inner side magnet 192 is smaller than the outer side magnet 182, thereby allowing tailoring of the magnetic fields on the two vault sidewalls. The opposite size relationship is also possible.

Figure 12:
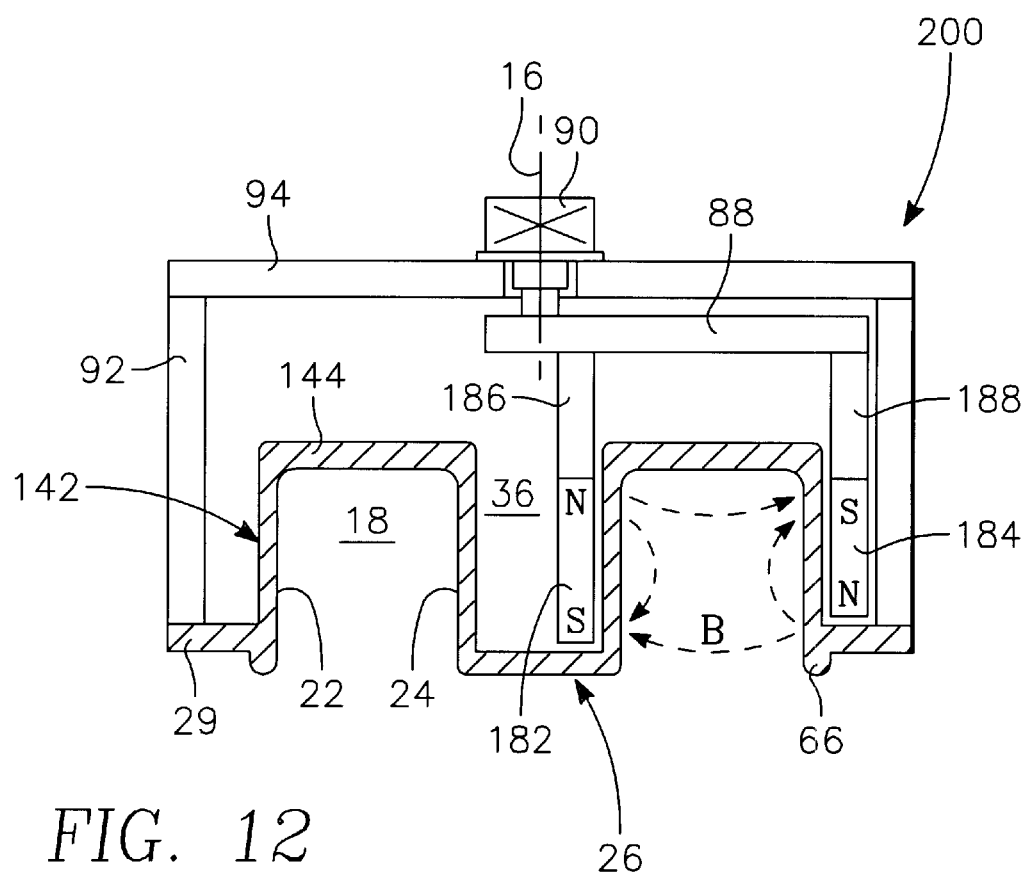

An eleventh embodiment 200 illustrated in the cross-sectional view of FIG. 12 dispenses with the top magnets and uses only the two side magnets 180, 182, which may be of the same size or of unequal size. In this case, the yoke 88 need not be magnetic.

It is thus seen that the complex geometry of the magnetron and target of the various embodiments of the invention provides additional controls on the intensity, directionality, and uniformity of sputtering.

It is possible to include multiple concentric vaults and to associate magnetic means with each of them.

It is also possible to additionally include an RF inductive coil to increase the plasma density in the processing space between the target and wafer. However, the unique configurations of the target and magnetron of the invention in large part eliminate the need for expensive coils.

Although the described embodiments have included a magnetron with a vault having vertical sidewalls and producing a substantially horizontal magnetic field may extend in the vault. However, it is appreciated that the magnetic field cannot be completely controlled, and inclinations of the magnetic field up to about 25°. Furthermore, the sidewalls may form more of a V-shaped vault with sidewall slope angles of up to 25°, but a maximum of 10° is preferred.

Although the invention has been described with respect to sputtering a coating substantially consisting of the material of the target, it can be advantageously used as well for reactor sputtering in which a gas such as nitrogen or oxygen is supplied into the chamber and reacts with the target material on the wafer surface to form a nitride or an oxide.

Processes

The magnetron 180 of FIG. 12 using stationary annular side magnets has been used in a number of experiments with sputtering copper and has shown unusual capabilities. We believe that the unusual results arise from the enhanced ionization fraction of the sputtered copper as it passes through the extended magnetic field in the vault. The copper ions can be attracted to the wafer by the inherent DC self-bias of a floating pedestal and the attraction can be increased by RF biasing the pedestal. The controlled attraction controls the energy and directionality of the copper ions incident on the wafer and deep into the via hole.

Figure 13:
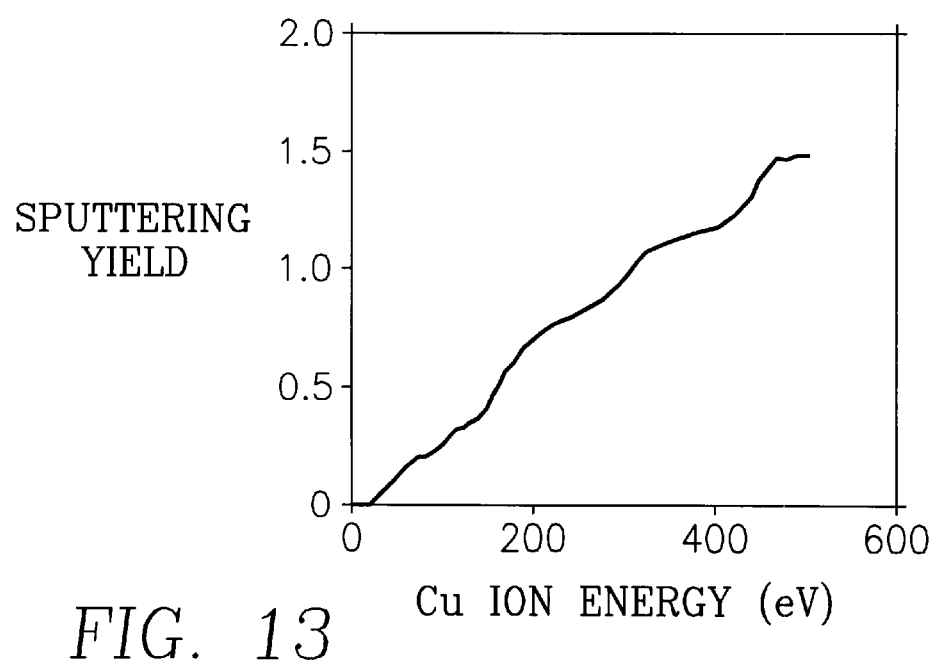
FIG. 13 is a graph of sputtering yield as a function of copper ion energy.
Figure 14:
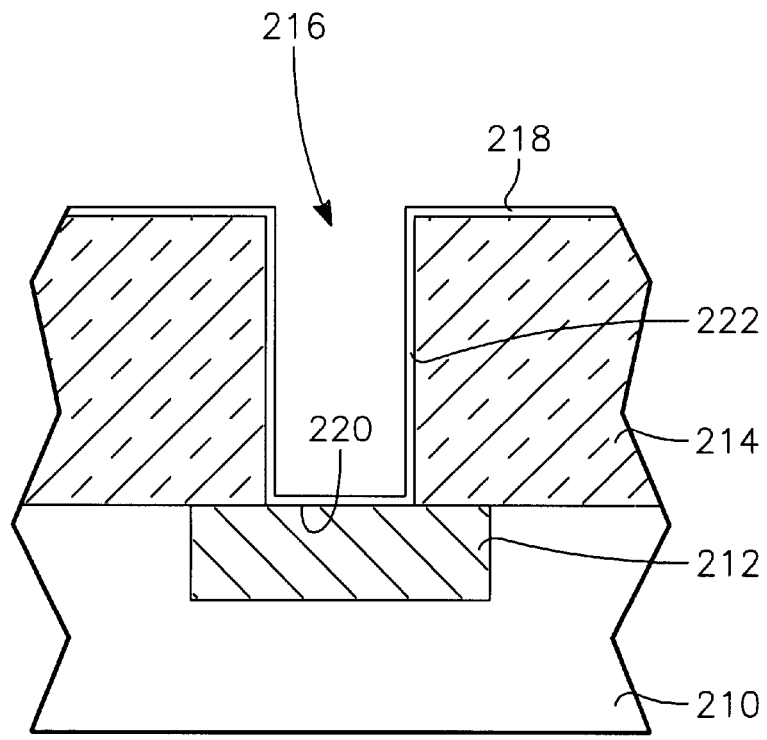
FIGS. 14 and 15 are cross-sectional views illustrating the effects of high-energy ionized sputter deposition.
Figure 15:
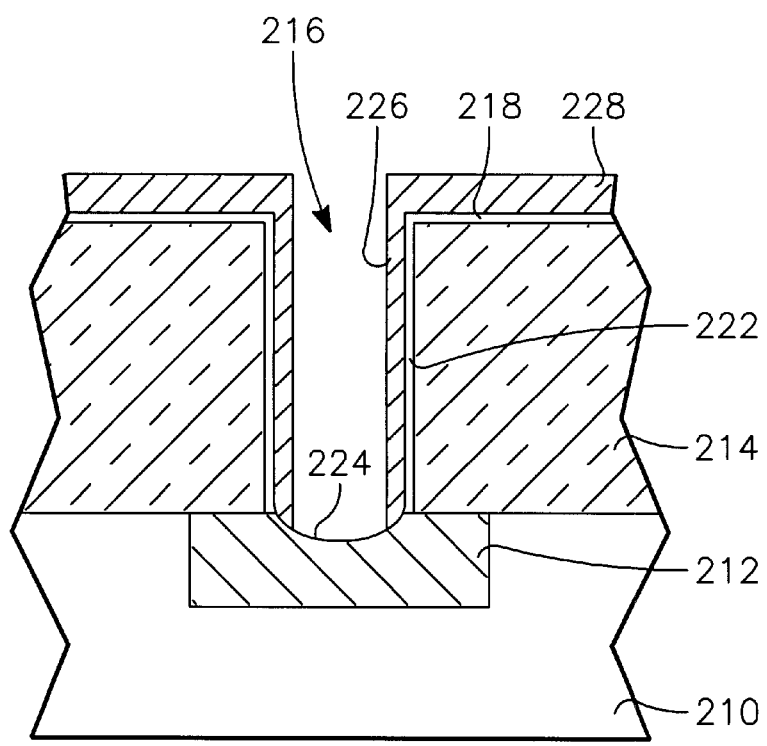

The sputtering yield for copper ions as a function of the ion energy is plotted in FIG. 13. Thus, the higher sputter particles energies possible with the inventive magnetron and other magnetrons can produce a high copper yield if the underlying copper is exposed during etching. Furthermore, the ratio of sputtering yield of tantalum relative to copper is 1:4 and further lower for TaN, thereby providing selectivity over copper. The believed effect of high-energy sputtered copper is schematically illustrated in the cross-sectional view of FIG. 14. A substrate 210 is formed with a lower copper metal feature 212. An inter-level dielectric layer 214 is deposited thereover and photolithographically etched to form a via hole 216. After pre-cleaning, a thin barrier layer 218 is substantailly conformally coated in the via 216 and over the top of the dielectric 214. The high energy sputter deposition and resultant resputtering causes a reduced deposition on the planar top of the oxide 214 and at the bottom 220 of the via hole 216. However, the copper resputtered from the bottom of the via hole 216 is of lower energy and is emitted generally isotropically. As a result, it tends to coat the via sidewalls 222 even more than the via bottom 220. The subsequent bottom sputtering further is likely to etch through the barrier layer 218 at the via bottom 220, thus exposing the underlying copper 212. The high copper yield further enhances the sidewall coverage. Furthermore, the top layer of the materials is cleaned in what is generally a PVD process. The result, as illustrated in FIG. 15, is that the barrier layer 218 is removed at the bottom of the via 216, and a recess 224, experimentally observed to be concave, is formed in the underlying copper 212. Further, relatively thick copper sidewalls 226 of thickness $d_S$ are deposited while a blanket layer 228 of thickness $d_B$ is formed over the planar top of the dielectric. Because of the high resputtering, overhangs do not form on the lip of the via 216. The sidewall coverage $d_S/d_B$ is observed to be in the neighborhood of 50 to 60% for high target power and low chamber pressure. The result is selective PVD.

The removal of the lower barrier layer has two implications. The contact resistance may be described as reduced because the barrier material is removed in the direct current path. Furthermore, the pre-clean that was necessary in the prior art for cleaning the top of the underlying material is no longer required for that job since the PVD step is itself cleaning the copper. Pre-cleaning on the sidewalls and top of the dielectric is much less of a requirement and may in some circumstances be eliminated.

It was also observed that the DC self-bias on a floating pedestal depends on the chamber pressure. For example, at 0.85 milliTorr, a self bias of about −20 VDC develops; at 0.7 milliTorr, about −50 VDC; and at 0.64 milliTorr, about −100 VDC. Thus, the chamber pressure can be used to a control the copper ion energy. Similarly, increases of the target power from 20 kW to 40 kW show about the same sequence of floating self-bias voltages, providing yet another tool for copper ion energy.

Applying RF bias to the pedestal through a coupling capacitor will also increase the DC self-bias.

Some of the more pronounced high-energy sputtering results were obtained with a chamber pressure of 0.5 milliTorr, 40 kW of target power, and 300 W of RF bias applied to the pedestal.

The sidewall coverage afforded by the high-energy ionized sputter deposition, though large in fraction, is considered too thin in absolute terms for use as a seed layer. It is believed that about 9 nm sidewall coverage is required in 3 $\mu$m-deep vias having an 11:1 aspect ratio. Furthermore, the blanket coverage is reduced over the conventional sputtering process and does not provide a sufficient electrical path for the electroplating current. Therefore, a short, more conventional copper sputter process may be used to complete the copper seed layer and eliminate any holes in it and to thicken the blanket coverage. The more conventional sputtering produces not only lower-energy copper ions but a larger fraction of neutral copper sputter particles, which are immune to wafer biasing. The two steps can be balanced to provide a balance between bottom coverage, sidewall coverage, and blanket thickness. That is, the conformality can be tailored. The more conventional copper sputter could be performed in a separate sputter reactor. However, in view of the small quantity needed to complete the seed layer, the same reactor used for the high-energy sputtering can adjusted to effect lower-energy sputtering. For example, the target energy can be reduced, the chamber pressure can be raised above 1 milliTorr, preferably about 1.5 milliTorr or higher, the RF pedestal bias power can be reduced, or a combination of the three.

Figure 16:
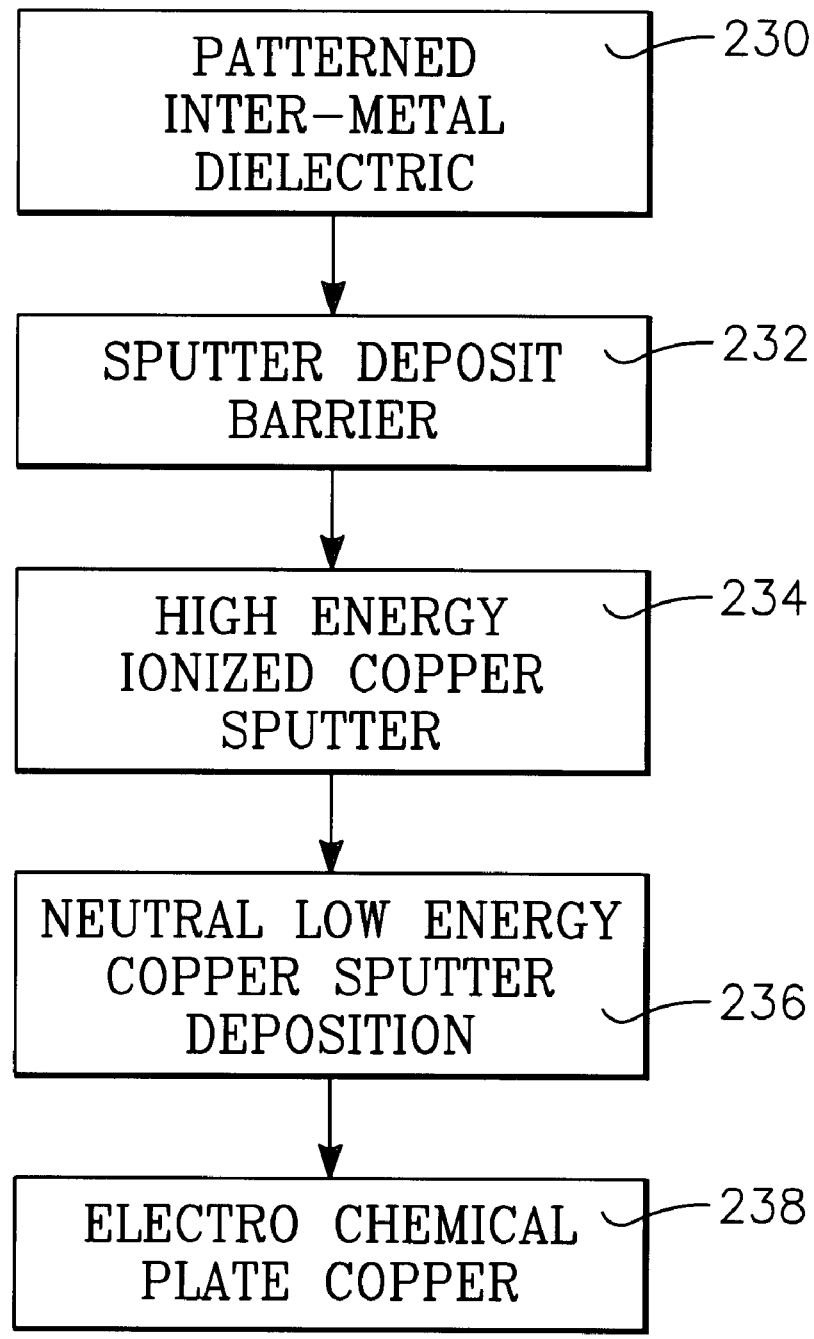
FIG. 16 is a flow diagram of an integrated copper via fill process.

A process for accomplishing a copper via is illustrated in the flow diagram of FIG. 16. In step 230, a inter-metal dielectric layer of, for example, TEOS silicon dioxide or a low-k dielectric whether carbon-based or silicon-based, is deposited, usually by a CVD process and photolithographically patterned with via holes using a plasma etching process. The dielectric patterning may be dual damascene, which includes both the vias and interconnect trenches in a common connecting structure. These steps are not directly part of the invention, and may be practiced in any number of ways. It is assumed that the material underlying the via holes is copper. Contact holes require a somewhat more complex process.

Thereafter, the wafer is placed in a multi-chamber PVD system. In some circumstances, no plasma preclean need be performed. Instead, one PVD system is used in step 232 to deposit the barrier layer into the via hole extending to underlying metal and on top of the dielectric. In step 234, the high-energy ionized copper deposition both cleans the bottom of the via hole and coats its sidewalls, as has been described. This step also cleans the interface of the underlying copper. In step 236, a lower-energy, more neutral copper sputter deposition is performed to complete the seed layer, also used as the electroplating electrode. The two steps 234, 236 can be at least partially separated by requiring the first step 234 to be performed at a pressure of less than 1.0 milliTorr, more preferably 0.7 milliTorr or less, and most preferably 0.5 milliTorr or less, while the second step 236 is performed at 1.5 milliTorr or above. In step 238, the copper metallization is completed with an electroplating or other electrochemical process.

Although this process has been described with reference to the inventive vault magnetron, similar high-energy ionized copper sputtering can be achieved in other ways. Achieving the desired selective PVD is believed to be eased by creating an energy distribution of the copper ions in the plasma with a peak energy of between 50 and 300 eV and by maintaining the ratio of argon ions to copper ions $Ar^+/Cu^+$ in the plasma at 0.2 or less. Of course, the ultimate low fraction is obtained with sustained self-sputtering. The low fraction of argon ions reduces the problems commonly experienced with HDP sputtering.

The inventive process need not completely remove the barrier layer at the bottom of the via to reduce the contact resistance. The outer portion, for example, of TiN while providing the barrier function has the highest resistivity. Hence, removing just the nitride portion would be advantageous.

Of course, the invention can be used with copper alloyed with a five percent of an alloying element such as silicon or magnesium. Further, many aspects of the invention are applicable as well to sputtering other materials.

What is claimed is:

1. An integrated copper fill process for filling a hole in a dielectric layer over a copper feature, comprising the steps of:
   depositing a barrier layer on the bottom and sidewalls of the hole;
   removing at least a portion of the barrier layer on the bottom of the hole, wherein said removing is performed in a chamber adapted for plasma sputtering of a metal target; and
   depositing a copper layer onto the sidewalls over the barrier layer and onto the bottom of the hole, performed in said chamber adapted for the plasma sputtering of said metal target.

2. The process of claim 1, wherein a vertically extending hole is formed between portions of said copper layer deposited on said sidewalls.

3. The process of claim 2, further comprising electroplating copper to fill said hole.

4. The process of claim 1, wherein said barrier layer comprises a metal nitride.

5. The process of claim 4, wherein said metal nitride comprises tantalum nitride.

6. The process of claim 4, wherein at least a portion of said barrier layer is deposited by plasma sputtering.

7. The process of claim 4, wherein at least a portion of said barrier layer is deposited by chemical vapor deposition.

8. An integrated copper fill process performed upon a substrate having a conductive feature formed at a surface adjacent a first layer, a dielectric layer formed over said first layer, a hole formed through said dielectric layer over said conductive feature, and a barrier layer is coated onto a bottom and sidewalls of said hole, comprising the steps of:
   removing said barrier layer from said bottom of said hole, wherein said removing is performed in a copper plasma sputtering chamber;
   depositing a copper layer onto said sidewalls over said barrier layer and onto said bottom of said hole, wherein said depositing step is performed in said copper plasma sputtering chamber; and
   then filling copper into said hole.

9. The process of claim 8, wherein said barrier layer comprises a metal nitride.

10. The process of claim 9, further comprising depositing at least a portion of said barrier layer by chemical vapor deposition.

11. The process of claim 9, further comprising depositing at least a portion of said barrier layer by plasma sputter.

12. The process of claim 8, wherein said conductive feature is a copper feature.

13. The process of claim 8, wherein said first layer is a dielectric layer.

14. An integrated copper fill process performed upon a substrate having a conductive feature formed at a surface adjacent a first dielectric layer, a second dielectric layer formed over said first dielectric layer, a hole formed through said second dielectric layer over said conductive feature, and a barrier layer coated on a bottom and sidewalls of said hole, comprising the steps of:
   a first step performed in a copper sputtering reactor of removing at least a portion of said barrier layer coated on said bottom of said hole; and
   a second step performed in said copper sputtering reactor of depositing a copper seed layer on said bottom and said sidewalls of said hole.

15. The process of claim 14, further comprising a subsequent step of electrochemically depositing copper into said hole.

16. The process of claim 14, wherein said first step additionally deposits copper on said sidewalls of said hole.

17. The process of claim 14, wherein said conductive feature is a copper feature and wherein said first step etches through said barrier layer at said bottom of said hole and cleans an exposed surface of said copper feature.

18. The process of claim 14, wherein said barrier layer comprises a metal layer overlain by a metal nitride layer and wherein said first step removes said metal nitride layer but leaves at least a portion of said metal layer at said bottom of said hole.

19. The process of claim 18, wherein said conductive feature is a copper feature and wherein said metal layer contacts said copper feature.

20. The process of claim 14, wherein said second step is performed with a lower level of power applied to a sputter target than in said first step.

21. The process of claim 14, wherein said second step is performed with a high pressure being maintained in said reactor than in said first step.

22. The process of claim 14, wherein said second step is performed with a higher RF bias applied to a pedestal electrode supporting said substrate than in said first step.

23. A method of removing a barrier layer formed at a bottom of a hole overlying a conductive feature in a first dielectric layer and formed in a second dielectric layer overlying said first dielectric layer, comprising the steps of:
   supporting said substrate on a pedestal electrode in a plasma sputter reactor having a metal sputter target in opposition to said pedestal electrode;
   admitting argon into said reactor;
   applying RF bias to said pedestal electrode; and
   applying DC power to said target to excite said argon into a plasma, thereby effecting a process to remove at least a portion of said barrier layer at the bottom of said hole.

24. The method of claim 23, wherein said process exposes said conductive feature at the bottom of said hole.

25. The method of claim 24, wherein said conductive feature is a copper feature.

26. The method of claim 25, wherein said target is a copper target.

* * * * *